United States Patent
Nelson et al.

(10) Patent No.: US 7,273,643 B2
(45) Date of Patent: *Sep. 25, 2007

(54) ARTICLE HAVING MULTIPLE SPECTRAL DEPOSITS

(75) Inventors: David J. Nelson, Rochester, NY (US); Sridhar Sadasivan, Rochester, NY (US); Ramesh Jagannathan, Rochester, NY (US); Seshadri Jagannathan, Pittsford, NY (US); Glen C. Irvin, Jr., Rochester, NY (US); Rajesh V. Mehta, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 432 days.

This patent is subject to a terminal disclaimer.

(21) Appl. No.: 10/602,430

(22) Filed: Jun. 24, 2003

(65) Prior Publication Data

US 2005/0008424 A1    Jan. 13, 2005

Related U.S. Application Data

(63) Continuation-in-part of application No. 10/602,840, filed on Jun. 24, 2003, now abandoned, and a continuation-in-part of application No. 10/602,429, filed on Jun. 24, 2003, now Pat. No. 7,153,539, and a continuation-in-part of application No. 10/602,134, filed on Jun. 24, 2003, now abandoned.

(51) Int. Cl.
 *B41M 5/50* (2006.01)
(52) U.S. Cl. .............. 428/32.37; 428/32.34; 428/690
(58) Field of Classification Search ............... 347/105; 106/31.33, 31.65; 428/32.34, 32.35, 32.36, 428/32.37
See application file for complete search history.

(56) References Cited

U.S. PATENT DOCUMENTS

| | | | |
|---|---|---|---|
| 4,734,227 A | 3/1988 | Smith | |
| 6,116,718 A | 9/2000 | Peeters et al. | 347/21 |
| 6,344,261 B1 * | 2/2002 | Kaule et al. | 428/195.1 |
| 6,361,161 B1 | 3/2002 | Anstadt et al. | |
| 6,471,327 B2 * | 10/2002 | Jagannathan et al. | 347/21 |
| 6,565,996 B2 * | 5/2003 | Hatwar et al. | 428/690 |
| 6,695,980 B2 * | 2/2004 | Irvin et al. | 252/301.16 |
| 6,700,322 B1 * | 3/2004 | Duggal et al. | 313/504 |
| 6,740,429 B2 * | 5/2004 | Aziz et al. | 428/690 |
| 7,153,539 B2 * | 12/2006 | Sadasivan et al. | 427/66 |
| 2003/0057821 A1 | 3/2003 | Fink et al. | |

FOREIGN PATENT DOCUMENTS

| | | |
|---|---|---|
| EP | 1275511 | 1/2003 |
| WO | WO 03/003982 | 1/2003 |
| WO | WO 03/006563 | 1/2003 |

* cited by examiner

*Primary Examiner*—Bruce H. Hess
(74) *Attorney, Agent, or Firm*—William R. Zimmerli

(57) ABSTRACT

An article having multiple spectral deposits is provided. The article can include a support and a single nanomorphic marking material adapted to reflect light having a first spectral content and adapted to reflect light having a second spectral content. The article can include a support and a nanomorphic marking material held by the support that luminesces at a plurality of wavelengths. The article can include a support and marking material having a first particle size and a second particle size. The first particle size reflects a first spectrum and the second particle size reflects a second spectrum. The article can include a support and a marking material held by said support with the marking material including a nanocrystalline particulate having a measurable property non-characteristic of the same marking material in a bulk state.

10 Claims, 6 Drawing Sheets

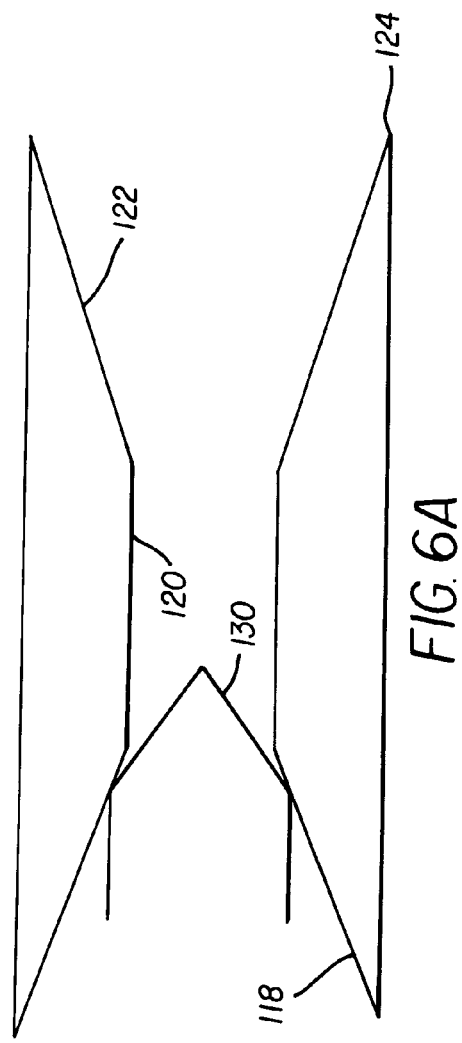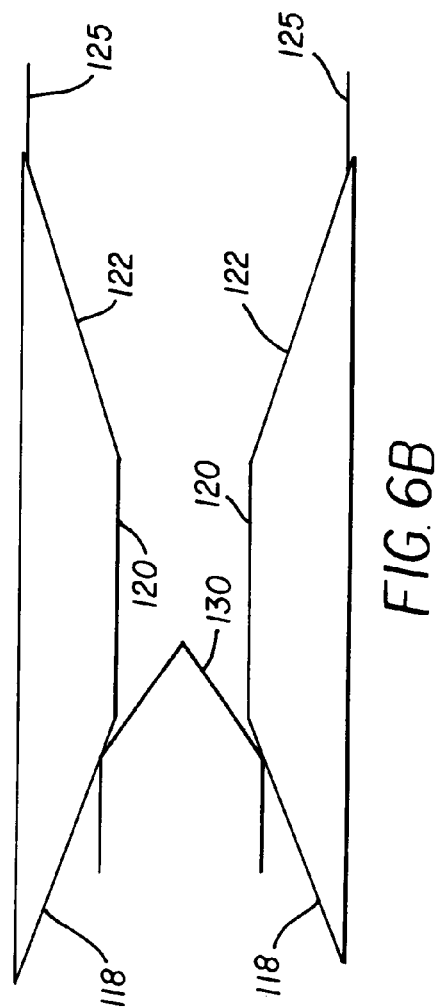

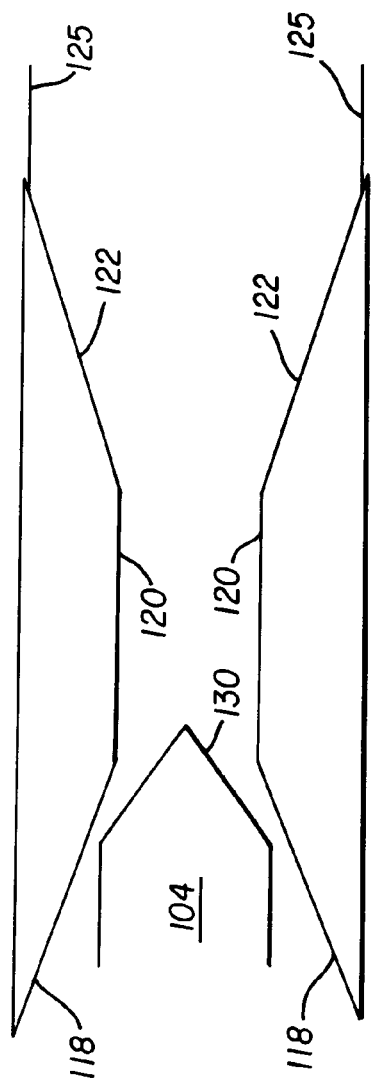
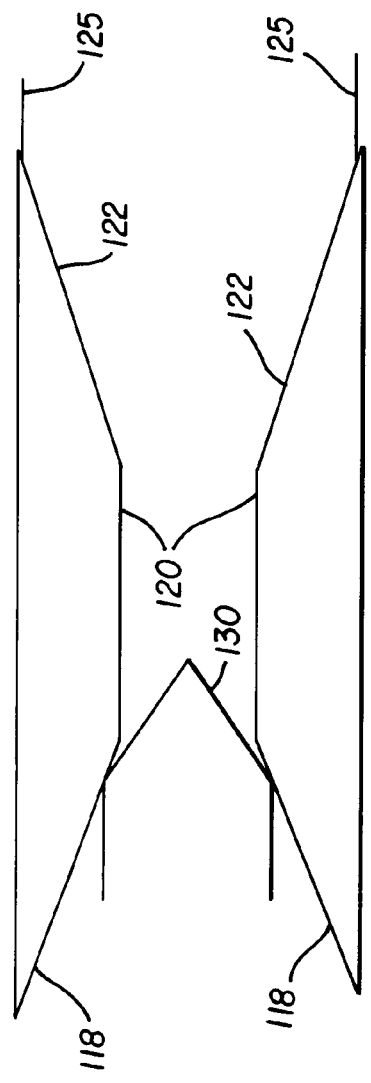

ARTICLE HAVING MULTIPLE SPECTRAL DEPOSITS

CROSS REFERENCE TO RELATED APPLICATIONS

This is a continuation-in-part of commonly assigned U.S. patent Publication-No.-2004/0263597 (now abandoned), entitled "An Apparatus And Method Of Producing Multiple Spectral Deposits From A Mixture Of A Compressed Fluid And A Marking Material" filed concurrently herewith, in the name of Nelson et al.; U.S. Pat. No. 7,153,539, entitled "An Apparatus And Method Of Color Tuning A Light Emitting Display" filed concurrently herewith in the name of Sadasivan et al.; and U.S. patent Publication No. 2004/0265622 (now abandoned), entitled "A Light Emitting Display" filed concurrently herewith in the name of Sadasivan et al.

FIELD OF THE INVENTION

This invention relates generally to printing and, more particularly, to printing with a solvent free marking material that produces multiple spectral deposits.

BACKGROUND OF THE INVENTION

Inkjet printers are known. In conventional inkjet printers, ink is ejected in the form of a drop through a printhead (having a plurality of discharge devices and nozzles) and onto a receiver in ether a continuous or on demand manner. Conventional inks typically include a colorant (either a dye or a pigment) and at least a-solvent. The ink is stored for use in an ink tank or ink cartridge with the tank or cartridge being connected in liquid communication with the printhead in one of several known ways. In multiple color inkjet printers, the printer includes a plurality of these ink tanks or ink cartridges with each tank or cartridge including an ink having a distinct color or color shade.

Conventional inkjet printers have disadvantages. In order to achieve high image quality metrics (for example, high resolution images (images approaching 900 dots per inch)) while maintaining desired printer productivity (often referred to as throughput), printheads typically include large numbers of discharge devices that are frequently actuated. This limits the viscosity of the ejected inks. As such, the viscosity of the ink is usually lowered by adding solvents such as water, for example. The increased solvent content results in slower ink drying times after the ink has been deposited on the receiver. This, in turn, decreases printer productivity. Increased solvent content can also result in an increase of image defects (for example, image bleeding) which negatively affects image quality metrics, for example, image resolution.

Another disadvantage of conventional inkjet printers includes nozzles that become partially or completely clogged and, therefore unusable. Typically, this is caused by the collection of dried ink and/or the collection of debris (for example, paper dust, dirt, etc.) in and around the nozzle. To reduce this problem, solvents such as glycol or glycerol are added to the ink which can lead to the problems discussed above.

Another disadvantage of conventional inkjet printers includes using multiple color ink tanks or cartridges when multiple color images are desired. This increases the cost associated with multiple color printing because individual ink tanks or cartridges, with each tank or cartridge containing a distinct ink color, are necessary.

Technologies that deposit materials onto a receiver using gaseous propellants are known. For example, Peeters et al., in U.S. Pat. No. 6,116,718, issued Sep. 12, 2000, discloses a print head for use in a marking apparatus in which a propellant gas is passed through a channel, the marking material is introduced controllably into the propellant stream to form a ballistic aerosol for propelling non-colloidal, solid or semi-solid particulate or a liquid, toward a receiver with sufficient kinetic energy to fuse the marking material to the receiver. There is a problem with this technology in that the marking material and propellant stream are two different entities and the propellant is used to impart kinetic energy to the marking material. When the marking material is added into the propellant stream in the channel, a non-colloidal ballistic aerosol is formed prior to exiting the print head. This non-colloidal ballistic aerosol, which is a combination of the marking material and the propellant, is not thermodynamically stable/metastable. As such, the marking material is prone to settling in the propellant stream which, in turn, can cause marking material agglomeration, leading to discharge device obstruction and poor control over marking material deposition.

Huck et al., in WO 02/45868 A2, discloses a method of creating a pattern on a surface of a wafer using compressed carbon dioxide. The method includes dissolving or suspending a material in a solvent phase containing compressed carbon dioxide, and depositing the solution or suspension onto the surface of the wafer, the evaporation of the solvent phase leaving a patterned deposit of the material. The wafer is prepatterned using lithography to provide the wafer with hydrophilic and hydrophobic areas. After deposition of the solution (or suspension) onto the wafer surface followed by the evaporation of the solvent phase, the material (a polymer) sticks to one of the hydrophobic and hydrophilic areas. The solution (or suspension) is deposited on the wafer surface either in the form of liquid drops or a feathered spray.

This method is disadvantaged because deposition using a feathered spray requires that the wafer surface be prepatterned prior to deposition. Hence, direct patterning of the wafer surface is not possible because of the diverging profile (feathered) of the spray. Additionally, a wafer surface that has not been prepatterned can not be patterned using this method. This method also requires time for drying so that the solvent phase of the liquid drops (or feathered spray) can evaporate. During the time associated with solvent phase evaporation, the solvent and the material can diffuse Technologies that use supercritical fluid solvents to create thin films are also known. For example, R. D. Smith in U.S. Pat. No. 4,734,227, issued Mar. 29, 1988, discloses a method of depositing solid films or creating fine powders through the dissolution of a solid material into a supercritical fluid solution and then rapidly expanding the solution to create particles of the marking material in the form of fine powders or long thin fibers, which may be used to make films. There is a problem with this method in that the free-jet expansion of the supercritical fluid solution results in a non-collimated/defocused spray that cannot be used to create high resolution patterns on a receiver. Further, defocusing leads to losses of the marking material.

As such, there is a need for a technology that permits solvent free deposition of a marking material that produces multiple spectral deposits on a receiver.

SUMMARY OF THE INVENTION

According to one feature of the present invention, an article includes a support and a marking material having a first particle size and a second particle size. The first particle size reflects a first spectrum and the second particle size reflects a second spectrum.

According to another feature of the present invention, an article includes a support and a single nanomorphic marking material adapted to reflect light having a first spectral content and adapted to reflect light having a second spectral content.

According to another feature of the present invention, an article includes a support and a marking material held by said support with the marking material including a nanocrystalline particulate having a measurable property non-characteristic of the same marking material in a bulk state.

According to another feature of the present invention, an article includes a support and a nanomorphic marking material held by the support. The marking material luminesces at a plurality of wavelengths.

BRIEF DESCRIPTION OF THE DRAWINGS

In the detailed description of the preferred embodiments of the invention presented below, reference is made to the accompanying drawings, in which:

FIGS. 6A-7B are schematic views of one example embodiment of a discharge device and an actuating mechanism made in accordance with the present invention.

DETAILED DESCRIPTION OF THE INVENTION

Figure 1:
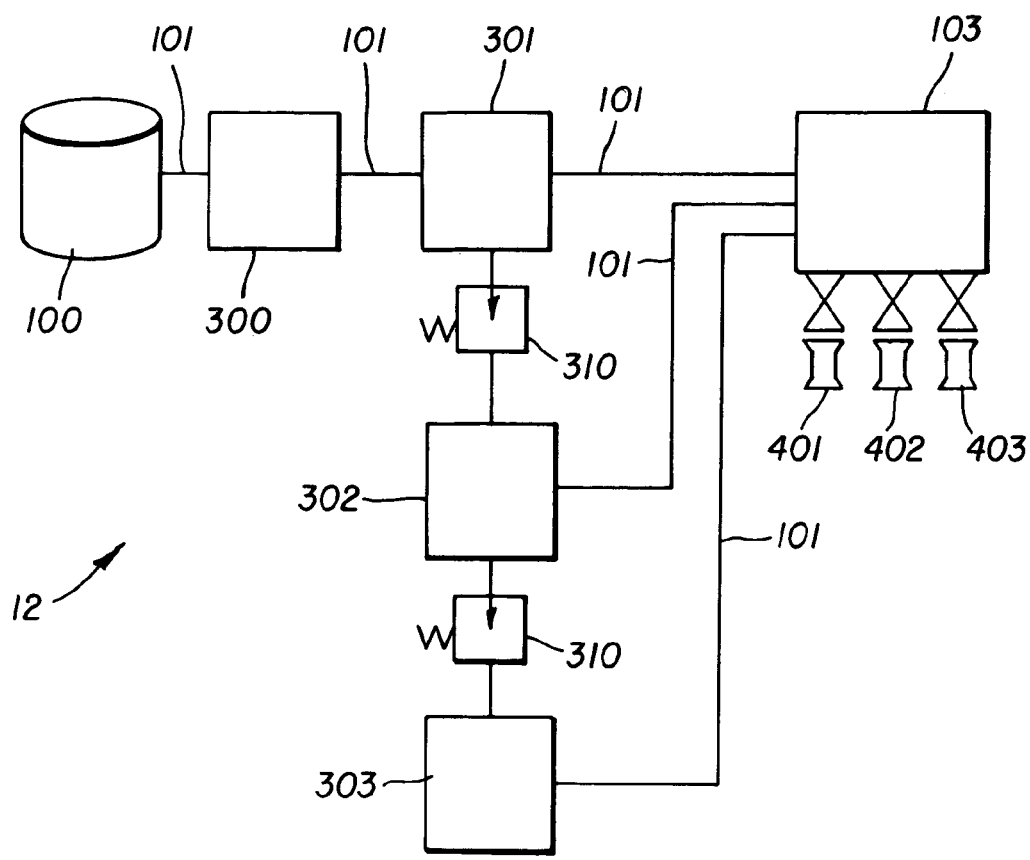
FIGS. 1-5 are schematic views of example embodiments made in accordance with the present invention.

The present description will be directed in particular to elements forming part of, or cooperating more directly with, apparatus in accordance with the present invention. It is to be understood that elements not specifically shown or described may take various forms well known to those skilled in the art. Additionally, materials identified as suitable for various facets of the invention, for example, marking materials, solvents, equipment, etc. are to be treated as exemplary, and are not intended to limit the scope of the invention in any manner.

As used herein, the term printing refers to apparatus and methods that delivery a marking material(s) to a substrate or a receiver. This includes, but is not limited to, the printing of text and images using dye based or pigment based ink, as well as the depositing of any other type of material onto or into a substrate or receiver.

Referring to FIGS. 1-5, example embodiments of a delivery system and a delivery apparatus 10 are shown. The delivery system 12 can be used to alter the reflected spectral peaks of an marking material(s) by varying process parameters or conditions (for example, pressure and/or temperature) in one or more formulation reservoirs and/or during material ejection to create an article having multiple colors and/or multiple color shades using one marking material.

Referring to FIGS. 1-5, embodiments of a delivery system 12 which alter pressure in order to achieve variations in colored streams from the printhead are shown. It is, however, recognized that controlling other process parameters, for example, temperature, and material (solute and/or dispersent) concentration, can produce similar effects on produced particle stream(s).

Referring again to FIG. 1, delivery system 12 includes a source of compressed fluid 100, a main formulation mixing tank 300, a highest pressure delivery tank 301, a medium pressure delivery tank 302, and a lowest pressure delivery tank 303. Fluid source 100 and tanks 300, 301, 302, 303 are connected in fluid communication through high pressure piping 101. Delivery system 12 enables the dissolution and/or dispersal of a selected marking material into a compressed fluid having a density greater than 0.1 g/cc$^3$.

Delivery system 12 supplies a printhead 103 with the solution and/or dispersion of the marking material under different pressure conditions, the ejection of which producing different colors from the same marking material. In the embodiment shown in FIG. 1, three tanks 301, 302, 303 are shown in order to supply the printhead with marking material at three different pressures. Generally, three colors are used in many color printing applications, but additional tanks or fewer tanks can be incorporated into the delivery system 12 as is necessary.

During deposition, the marking material ejected through nozzle 401 (exemplary of one or more nozzles connected to the highest pressure delivery tank 301) produces a first color marking material. The marking material ejected through nozzle 402 (exemplary of one or more nozzles connected to the medium pressure delivery tank 302) produces a second color marking material. The marking material ejected through nozzle 403 (exemplary of one or more nozzle connected to the lowest pressure delivery tank 303) produces a third color marking material. In order to reduce the pressure in the medium pressure tank 302 and the lower pressure tank 303, commonly available condition controlling devices 310 are used. In the case of a pressure regulated system, these devices are pressure regulation valves. One type of suitable condition controlling device 310 is commonly referred to as a pressure reduction valve, and is commercially available from, for example, Keidel Supply Co., Norwood, Ohio; Tyco valves and Controls, Houston, Tex.; etc. In this configuration, delivery system 12 is self-regulating in that pressures in the individual tanks 301-303 can be maintained at optimum levels even though pressure variations typically occur as the material is being ejected. Additionally, although condition controlling with respect to pressure has been discussed with reference to a pressure reducing valve, there are other ways of controlling (for example, generating and/or reducing) pressure. For example, individual sources of compressed fluids could be supplied to the system at different pressures.

If the system is designed around temperature, the condition controlling device 310 can be a temperature control device or any other suitable condition controlling mechanism. For example, a temperature controlling device can include heating mechanisms (heated coils, etc.) and/or cooling mechanisms (water jackets, etc.). Similarly, if the system were operating based on solute concentration, the delivery tanks would each contain various concentrations of the marking material.

Figure 2:
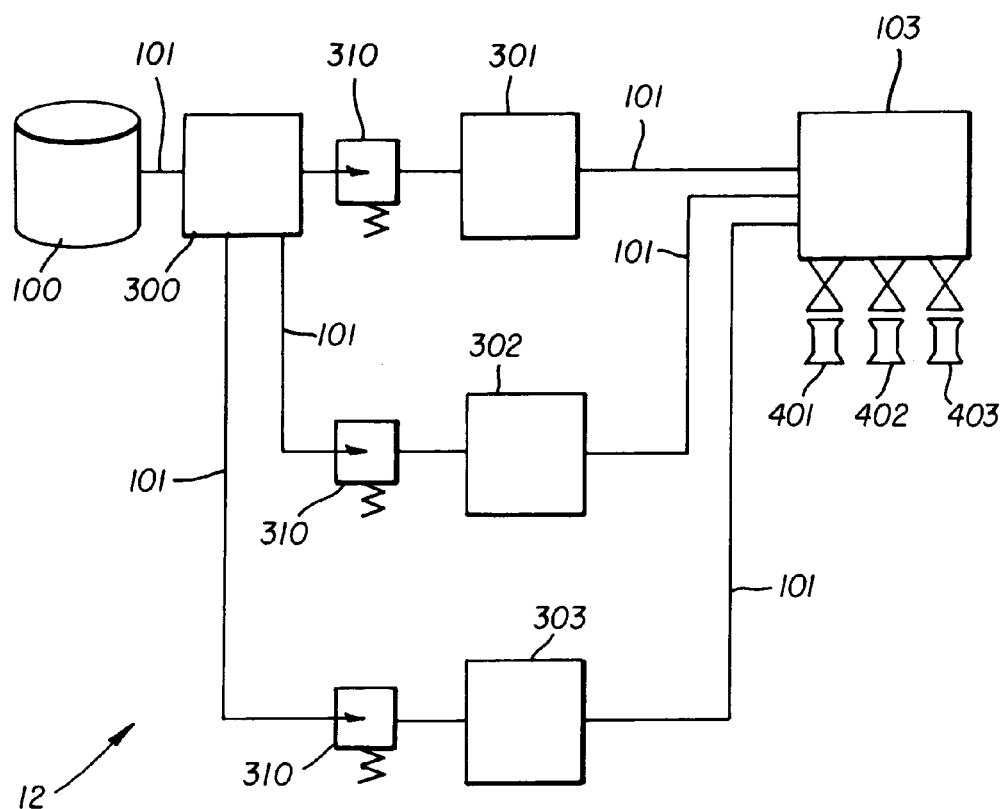

Although delivery system 12 is capable of providing distinct colors to create a multi-color display, as shown in FIG. 2 using constant pressure delivery tanks 301-303, condition controlling devices 310 can be adjusted during operation to provide additional pressures for producing more colors. Pressure variation can also be used to increase color gamut and/or color shades depending on the application.

Referring to FIG. 2, an alternate embodiment of delivery system 12 is shown. Delivery system 12 includes a source of compressed fluid 100, a main formulation mixing tank 300, a highest pressure delivery tank 301, a medium pressure delivery tank 302, and a lowest pressure delivery tank 303. Fluid source 100 and tanks 300, 301, 302, 303 are connected in fluid communication through high pressure piping 101. Delivery system 12 enables the dissolution and/or dispersal of a selected marking material into a compressed fluid having a density greater than 0.1 $g/cc^3$.

Delivery system 12 supplies a printhead 103 with the solution and/or dispersion of the marking material under different conditions (for example, pressure and/or temperature), the ejection of which producing different colors from the same marking material. In this embodiment, each tank 301, 302, 303 is connected to formulation tank 300 through a condition controlling device 310 which allows for individual pressure control of each tank 301, 302, 303. In the embodiment shown in FIG. 3, three tanks 301, 302, 303 are shown. Additional tanks or fewer tanks can be incorporated into the delivery system. 12 as is necessary. Material deposition is accomplished as described above with reference to FIG. 1.

Figure 3:
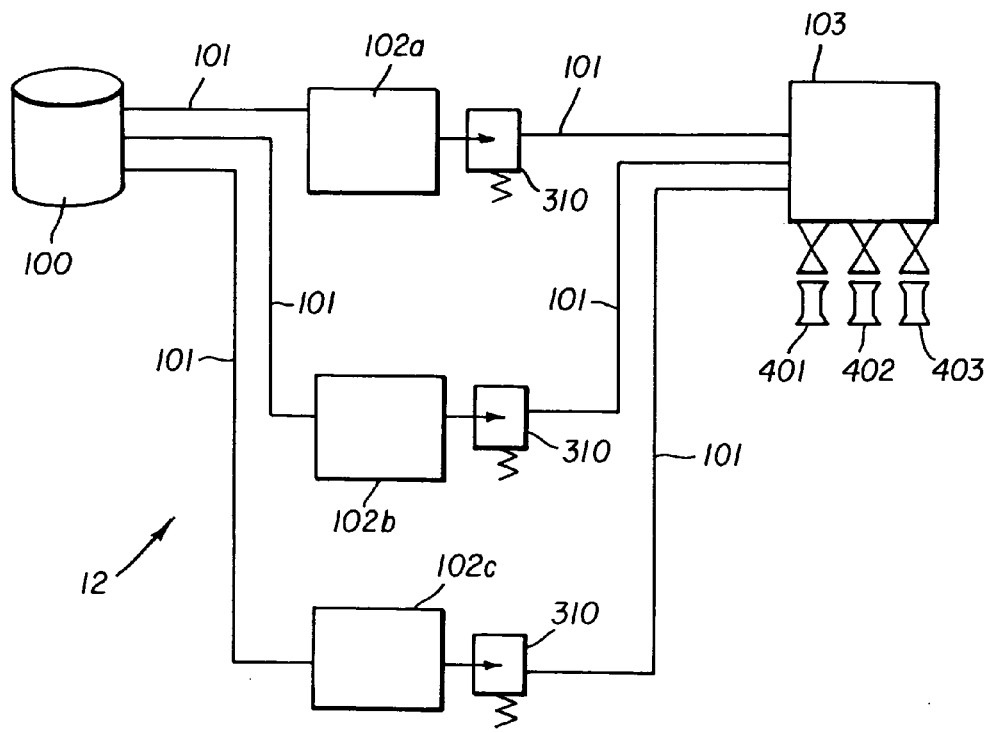

Referring to FIG. 3, an alternate embodiment of delivery system 12 is shown. In this embodiment, formulation and deposition conditions are controlled in order to achieve a improved color gamut. Delivery system 12 includes material reservoirs 102a, 102b, 102c with each reservoir being used to formulate a solution and/or dispersion using a distinct marking material. Compressed fluid is supplied to reservoirs 102a, 102b, 102c by a source of compressed fluid 100 through piping 101. Each reservoir 102a, 102b, 102c supplies a printhead 103 through a condition controlling device 310. As such, each marking material being supplied to printhead 103 can be independently controlled prior to and/or during marking material delivery.

Prior to deposition, material reservoirs 102a, 102b, 102c are maintained at the highest desired pressure for each material, and are independently controlled (for example, pressure being reduced) during deposition using condition controlling devices 310 to produce different spectral characteristics with each material. In this manner, an wider overall color gamut can be produced when a material is ejected through one of nozzles 401, 402, 403, by allowing one or more of the marking materials to be deposited over a range of operating conditions thereby producing different spectral reflection characteristics. In conventional printing, when desired, more than three materials can be used to increase color gamut. In this embodiment each marking material is capable of varying over a range of spectral reflection characteristics which reduces the need for additional marking materials or additional dopants to create increased color gamut.

Figure 4:
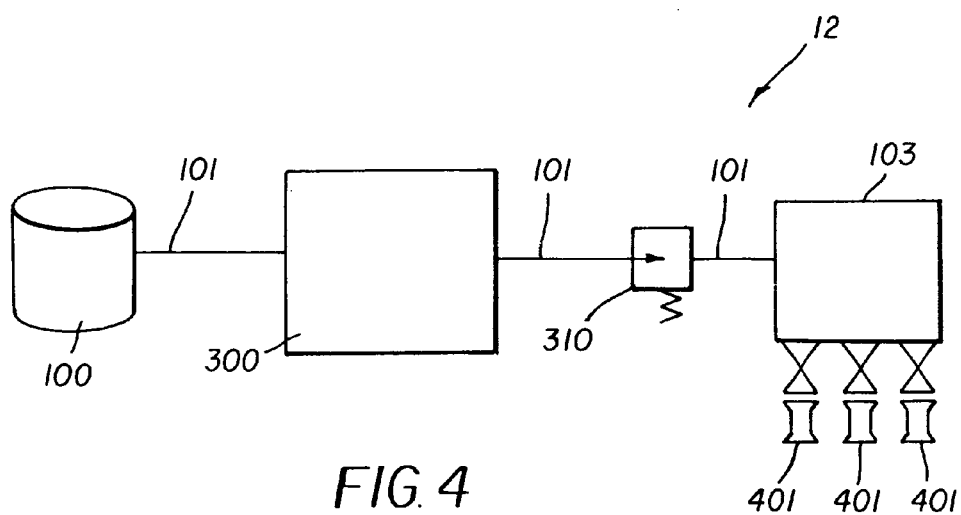

Referring to FIG. 4, another embodiment of a delivery system 12 is shown. In this embodiment, the main formulation tank 300 of the delivery system 12, as supplied by the source of compressed fluid 100, is used to supply printhead 103 with all of the material used during deposition. Typically, this embodiment is operated by depositing a first color and then depositing additional colors if desired.

The main formulation mixing tank 300 is pressurized to the maximum desired pressure for producing a first color by ejecting the material through printhead 103 over a substrate (not shown). If additional color(s)are desired, the condition controlling device 310 is set to another pressure (for example, the medium pressure, as discussed above) and the material is ejected using printhead 103. When a third color is desired, a third pressure is set using the condition controlling device 310, etc.

Figure 5:
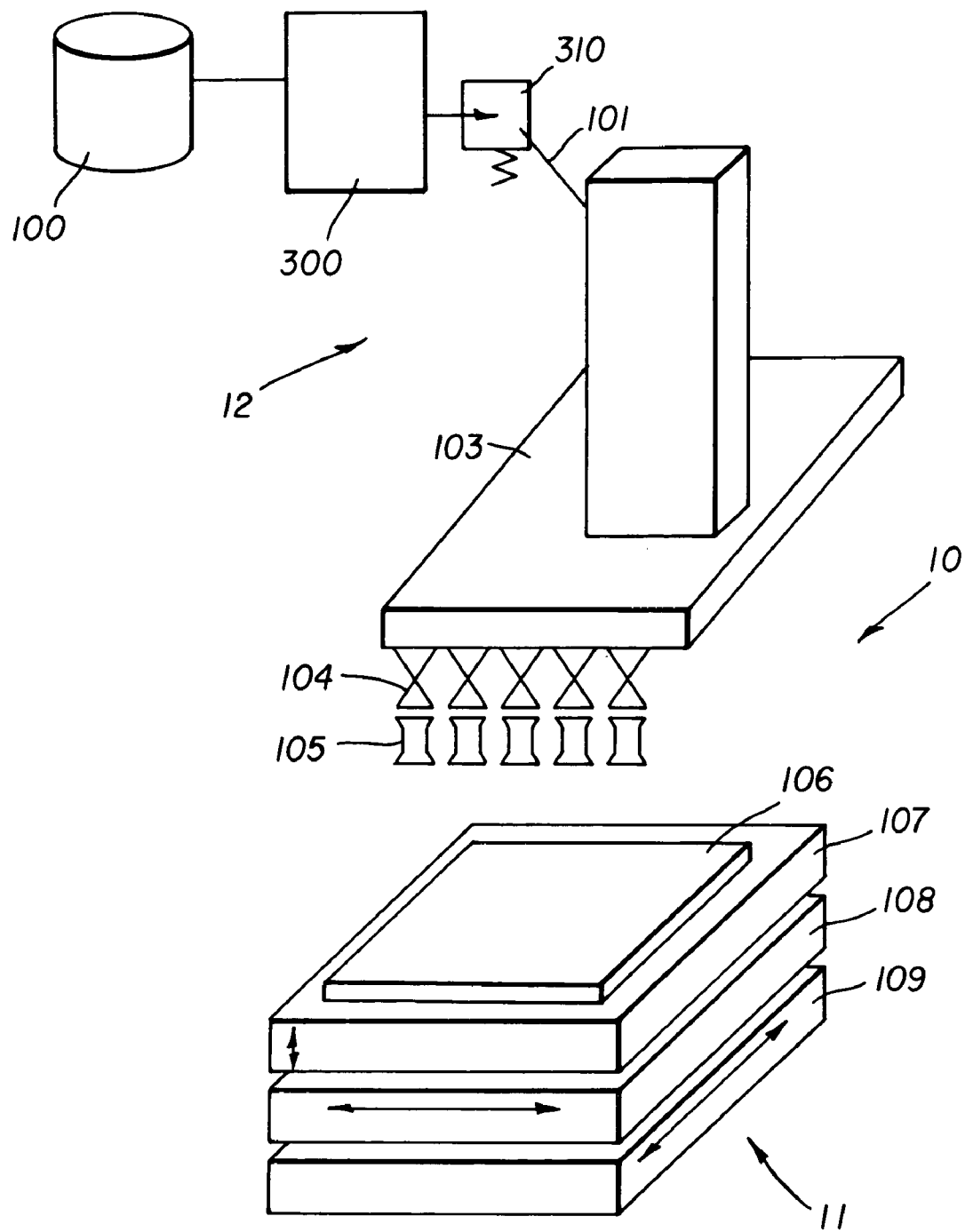

Referring to FIG. 5, one example of a delivery apparatus 10 is shown. Delivery apparatus 10 includes delivery system 12 connected to printhead 103. Printhead 103 is positioned over a substrate retaining device 11. In this embodiment, printhead 103 remains stationary during operation while substrate 106 is moved using one or more of the translation stages 107, 108, 109 of substrate retaining device 11. Alternately, the printhead 103 can be moved in one direction, while the substrate 106 is moved in another direction.

Other delivery apparatus 10 configurations and material delivery methods are possible. For example, the marking materials (with each marking material being maintained under a distinct condition) can be ejected through printhead 103 in succession or at the same time. (See, for example, U.S. patent application Ser. No. 10/016,054, filed on Dec. 6, 2001, in the name of Nelson et al.; and/or U.S. patent application Ser. No. 10/162,956, filed on Jun. 5, 2002, in the name of Sadasivan et al.). Marking material can also be delivered through delivery apparatus 10 in a continuous manner. (See, for example, U.S. patent application Ser. No. 10/287,579, filed on Nov. 4, 2002, in the name of Sadasivan et al.). Delivery apparatus 10 can also be calibrated and cleaned as is necessary. (See, for example, U.S. patent application Ser. No. 10/163,326, filed on Jun. 5, 2002, in the name of Sadasivan et al.). Additionally, precoats and/or overcoats can be applied either before or after delivering marking material to the substrate 106. (See, for example, U.S. patent application Ser. No. 10/051,888, filed on Jan. 17, 2002, in the name of Sadasivan et al.). The depth of marking material penetration into substrate 106 can also be controlled using delivery apparatus 10. (See, for example, U.S. patent application Publication US 2003/0030706 A1, published Feb. 13, 2003, in the name of Jagannathan et al.).

Referring to FIGS. 6A-7B, the discharge device 105 of nozzle (s) 401, 402, 403 of print head 103 includes a first variable area section 118 followed by a first constant area section 120. A second variable area section 122 diverges from constant area section 120 to an end 124 of discharge device 105. The first variable area section 118 converges to the first constant area section 120. The first constant area section 118 has a diameter substantially equivalent to the exit diameter of the first variable area section 120. Alternatively, discharge device 105 can also include a second constant area section 125 positioned after the variable area section 122. Second constant area section 125 has a diameter substantially equivalent to the exit diameter of the variable area section 122. Discharge devices 105 of this type are commercially available from Moog, East Aurora, N.Y.; and Vindum Engineering Inc., San Ramon, Calif.

The actuating mechanism 104 is positioned within discharge device 105 and moveable between an open position 126 and a closed position 128 and has a sealing mechanism 130. In closed position 128, the sealing mechanism 130 in the actuating mechanism 104 contacts constant area section 120 preventing the discharge of the thermodynamically stable mixture of supercritical fluid and marking material. In open position 126, the thermodynamically stable mixture of supercritical fluid and marking material is permitted to exit discharge device 105.

The actuating mechanism 104 can also be positioned in various partially opened positions depending on the particular printing application, the amount of thermodynamically stable mixture of fluid and marking material desired, etc.

Alternatively, actuating mechanism 104 can be a solenoid valve having an open and closed position. When actuating mechanism 104 is a solenoid valve, it is preferable to also include an additional position controllable actuating mechanism to control the mass flow rate of the thermodynamically stable mixture of fluid and marking material.

In a preferred embodiment of discharge device 105, the diameter of the first constant area section 120 of the discharge device 105 ranges from about 20 microns to about 2,000 microns. In a more preferred embodiment, the diameter of the first constant area section 120 of the discharge device 105 ranges from about 10 microns to about 20 microns. Additionally, first constant area section 120 has a predetermined length from about 0.1 to about 10 times the diameter of first constant area section 120 depending on the application. Sealing mechanism 130 can be conical in shape, disk shaped, etc.

Referring back to FIGS. 1-5, the delivery system 12 takes a predetermined marking material and a carrier fluid (for example, a solvent) to a compressed fluid state, makes a solution and/or dispersion of the predetermined marking material in the compressed fluid, and delivers the material(s) as a collimated and/or focused beam onto a substrate 106 in a controlled manner. The marking material can be a combination of marking materials. (See, for example, U.S. Pat. No. 6,471,327 B2, issued to Jagannathan et al., on Oct. 29, 2002.).

In this context, the chosen solvents taken to a compressed fluid state are gases at ambient pressure and temperature. Ambient conditions are preferably defined as temperature in the range from −100 to +100° C., and pressure in the range from $1 \times 10^{-8}$-1000 atm for this application.

The fluid carrier, contained in the fluid source 100, is any material that dissolves/solubilizes/disperses a material. The fluid source 100 delivers the fluid carrier at predetermined conditions of pressure, temperature, and flow rate as a compressed fluid. Materials that are above their critical point, as defined by a critical temperature and a critical pressure, are known as supercritical fluids. The critical temperature and critical pressure typically define a thermodynamic state in which a fluid or a material becomes supercritical and exhibits gas like and liquid like properties. Materials that are at sufficiently high temperatures and pressures below their critical point are known as compressed liquids. Materials that are at sufficiently high critical pressures and temperatures below their critical point are known as compressed gases. Materials in their supercritical fluid and/or compressed liquid/compressed gas state that exist as gases at ambient conditions find application here because of their unique ability to solubilize and/or disperse materials of interest when in their compressed fluid state.

Fluid carriers include, but are not limited to, carbon dioxide, nitrous oxide, ammonia, xenon, ethane, ethylene, propane, propylene, butane, isobutane, chlorotrifluoromethane, monofluoromethane, sulphur hexafluoride and mixtures thereof. Carbon dioxide is generally preferred in many applications, due its characteristics, such as low cost, wide availability, etc.

The formulation reservoir 300 in FIGS. 1-5 is utilized to dissolve and/or disperse predetermined marking material in a compressed fluid (compressed liquid, compressed gas, or supercritical fluid) with or without dispersants and/or surfactants, at desired formulation conditions of temperature, pressure, volume, and concentration. The combination of marking material and compressed fluid is typically referred to as a mixture, formulation, etc.

The formulation reservoir 300 in FIGS. 1-5 can be made out of any suitable materials that can safely operate at the formulation conditions. An operating range from 0.001 atmosphere ($1.013 \times 10^2$ Pa) to 1000 atmospheres ($1.013 \times 10^8$ Pa) in pressure and from −25 degrees Centigrade to 1000 degrees Centigrade is generally preferred. Typically, the preferred materials include various grades of high pressure stainless steel. However, it is possible to use other materials if the specific deposition or etching application dictates less extreme conditions of temperature and/or pressure.

The formulation reservoir 300 in FIGS. 1-5 should be adequately controlled with respect to the operating conditions (pressure, temperature, and volume). The solubility/dispersibility of materials depends upon the conditions within the formulation reservoir 300. As such, small changes in the operating conditions within the formulation reservoir 300 can have undesired effects on material solubility/dispensability.

Additionally, any suitable surfactant and/or dispersant material that is capable of solubilizing/dispersing the materials in the compressed fluid for a specific application can be incorporated into the mixture of material and compressed fluid. Such materials include, but are not limited to, fluorinated polymers such as perfluoropolyether, siloxane compounds, etc.

The marking material can be controllably introduced into the formulation reservoir 300. The compressed fluid is also controllably introduced into the formulation reservoir 300. The contents of the formulation reservoir 300 are suitably mixed, using a mixing device to ensure intimate contact between the predetermined marking material and compressed fluid. As the mixing process proceeds, marking material are dissolved or dispersed within the compressed liquid/compressed gas/supercritical fluid. The process of dissolution/dispersion, including the amount of marking materials and the rate at which the mixing proceeds, depends upon the marking materials itself, the particle size and particle size distribution of the marking material (if the marking material is a solid), the compressed fluid used, the temperature, and the pressure within the formulation reservoir 300. When the mixing process is complete, the mixture or formulation of marking materials and compressed fluid is thermodynamically stable/metastable, in that the marking materials are dissolved or dispersed within the compressed fluid in such a fashion as to be indefinitely contained in the same state as long as the temperature and pressure within the formulation chamber are maintained constant. This state is distinguished from other physical mixtures in that there is no settling, precipitation, and/or agglomeration of marking material particles within the formulation chamber, unless the thermodynamic conditions of temperature and pressure within the reservoir are changed. As such, the marking material and compressed fluid mixtures or formulations of the present invention are said to be thermodynamically stable/metastable. This thermodynamically stable/metastable mixture or formulation is controllably released from the formulation reservoir 300 through the discharge device 105 and actuating mechanism 104.

During the deposition process, the materials are precipitated from the compressed fluid as the temperature and/or pressure conditions change. The precipitated materials are preferably directed towards a substrate 106 by the discharge device 105 through the actuating mechanism 104 as a focussed and/or collimated beam. The invention can also be practiced with a divergent beam provided that the diameter of first constant area section 120 and printhead 103 to receiver 106 distance are appropriately small. For example, in a discharge device 105 having a 10 um first constant area section 120 diameter, the beam can be allowed to diverge before impinging receiver 106 in order to produce a pixel size of required dimensions.

Discharge device 105 diameters of these sizes can be created with modern manufacturing techniques such as focused ion beam machining, MEMS processes, etc. Alternatively, capillary tubing made of PEEK, polyimide, etc. having a desired inner diameter (ca. 10 microns) and a desired outer diameter (ca. 15 microns) can be bundled together in order to form printhead 103 (for example, a rectangular array of capillaries in a 4×100, a 4×1000, or a 4×10000 matrix). Each capillary tube is connected to an actuating mechanism 104 thereby forming discharge device 105. Printing speed for a printhead formed in this fashion can be increased for a given actuating mechanism frequency by increasing the number of capillary tubes in each row.

The particle size of the marking materials deposited on the receiver 105 is typically in the range from 1 nanometer to 1000 nanometers. The particle size distribution may be controlled to be uniform by controlling the rate of change of temperature and/or pressure in the discharge device 105, the location of the receiver 106 relative to the discharge device 105, and the ambient conditions outside of the discharge device 105.

The print head 103 is also designed to appropriately change the temperature and pressure of the formulation to permit a controlled precipitation and/or aggregation of the materials. As the pressure is typically stepped down in stages, the formulation fluid flow is self-energized. Subsequent changes to the formulation conditions (a change in pressure, a change in temperature, etc.) result in the precipitation and/or aggregation of the material, coupled with an evaporation of the compressed fluid. The resulting precipitated and/or aggregated material deposits on the receiver 106 in a precise and accurate fashion. Evaporation of the supercritical fluid and/or compressed liquid/compressed gas can occur in a region located outside of the discharge device 105. Alternatively, evaporation of the compressed fluid can begin within the discharge device 105 and continue in the region located outside the discharge device 105. Alternatively, evaporation can occur within the discharge device 105.

A beam (stream, etc.) of the material and the compressed fluid is formed as the formulation moves through the discharge device 105. When the size of the precipitated and/or aggregated materials is substantially equal to an exit diameter of the discharge device 105, the precipitated and/or aggregated materials have been collimated by the discharge device 105. When the sizes of the precipitated and/or aggregated materials are less than the exit diameter of the discharge device 105, the precipitated and/or aggregated materials have been focused by the discharge device 105.

The substrate 106 is positioned along the path such that the precipitated and/or aggregated predetermined materials are deposited on the receiver 106. The distance of the receiver 106 from the discharge device 105 is chosen such that the compressed fluid evaporates to the gas phase prior to reaching the receiver 106. Hence, there is no need for a subsequent receiver drying processes. Alternatively, the receiver 106 can be electrically or electrostatically charged, such that the location of the material in the receiver 106 can be controlled.

It is also desirable to control the velocity with which individual particles of the marking material are ejected from the discharge device 105. As there is a sizable pressure drop from within the printhead 103 to the operating environment, the pressure differential converts the potential energy of the printhead 103 into kinetic energy that propels the material particles onto the receiver 106. The velocity of these particles can be controlled by suitable discharge device 105 with an actuating mechanism 104. Discharge device 105 design and location relative to the receiver 106 also determine the pattern of material deposition.

The temperature of the discharge device 105 can also be controlled. Discharge device temperature control may be controlled, as required, by specific applications to ensure that the opening in the discharge device 105 maintains the desired fluid flow characteristics.

The substrate 106 can be any solid material, including an organic, an inorganic, a metallo-organic, a metallic, an alloy, a ceramic, a synthetic and/or natural polymeric, a gel, a glass, or a composite material. Additionally, the substrate 106 can have more than one layer. The substrate 106 can be a sheet or roll of any size.

It was previously thought in the printing industry that in order to achieve differing spectral reflectance on a printed page, differing material chemistries were required necessitating multiple functional materials. The inventors of the present invention have discovered otherwise.

As shown in the experimental data which follows, a marking material can be made to exhibit different spectral properties after going through the compressed fluid delivery process described above (as compared to the same marking material being delivered using conventional delivery processes). As such, marking materials deposited on a substrate using the compressed fluid delivery method will exhibit a luminescence spectrum that is distinct from the luminescence spectrum the same marking material usually exhibits.

It has also been found that differing spectral outputs in reflection can be achieved with the same marking material by varying the delivery process conditions or parameters. As such, the printing apparatus 10, described above, can be used to alter the reflected spectral peaks of the marking material(s) ejected through printing apparatus 10 by controlling and/or varying the conditions or parameters (for example, pressure, temperature, etc.) in the formulation reservoir and/or during ejection.

The delivery methods and apparatus described do not depend on a particular type of marking material or process condition or parameter. As such, although the examples discussed below represent three distinct pressures, the practice of the invention is not limited to these pressures (or to pressure in general) and will vary depending on a given application.

EXAMPLE 1

10 mg of C-545T and 183 g of $CO_2$ were placed in a high-pressure cell at 40° C. and 300 bar, and stirred for 30 min. When the system was visibly homogeneous, the contents of cell were released as a spray into ambient conditions in an expansion chamber, through a needle valve that was attached to a 2-inch long 65 µm diameter capillary, for 5 seconds. The pressure in the high-pressure cell was maintained at 300 bar during that release and the spray was directed into a glass vial. The precipitate that was collected was blue in color and was then analyzed for photoluminescence, and observed for color.

EXAMPLE 2

The procedure in Example 1 was repeated except the pressure in the high-pressure cell was maintained at 200 bar.

The precipitate collected was green in color and was then analyzed for photoluminescence, and observed for color.

EXAMPLE 3

The procedure in Example 1 was repeated except the pressure in the high-pressure cell was maintained at 150 bar. The precipitate collected was red in color and was then analyzed for photoluminescence, and observed for color.

Results

The photoluminescence of the precipitates generated from Examples 1, 2, and 3, and a reference powder (C545T) were determined by exciting each at 457 nm with a standard Helium Neon laser. The results are shown in the following graphs and the corresponding peak photoluminescence wavelengths are shown in TABLE 1 below.

TABLE 1

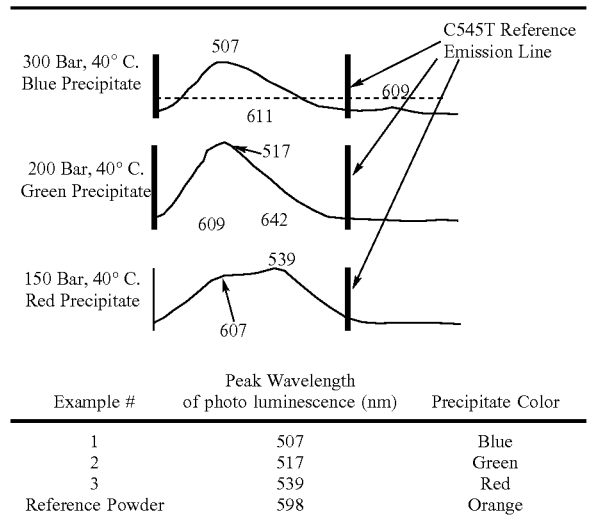

| Example # | Peak Wavelength of photo luminescence (nm) | Precipitate Color |
|---|---|---|
| 1 | 507 | Blue |
| 2 | 517 | Green |
| 3 | 539 | Red |
| Reference Powder | 598 | Orange |

The precipitated marking material, described above, can be referred to as a nanomorphic marking material. The term nanomorph is defined in the paragraphs that follow.

Interactions between atoms in condensed matter result in properties that are characteristic of bulk solids. Bulk solids are classified as large particles or crystallites that are multiple tens of nanometers or larger in size. Classic scientific fields of study including physics, chemistry, and materials science that are used to explain the physical, mechanical, optical, etc., properties of bulk solids require the use of quantum mechanics to explain observed phenomena such as chemical bonds, superconductivity, electron spin and magnetic properties of matter, radiant heat emission, or radioactive decay.

As the length scale in these bulk solids approach a very small size, <20 nm (nanometer, $10^{-9}$ meter), these materials exhibit changes in properties that diverge from those in the bulk state. Particles in this size range can be referred to as nanocrystals. These changes in properties are the result of a reduction in electron energy levels. For example, small nanocrystals of gallium nitride (GaN), referred to as quantum dots, have been shown to have a photoluminescence peak centered at 2.95 eV (electron volts), which is 0.5 eV below the bulk GaN bandgap (B. Daudin et al., MRS Internet J. Nitride Semicond. Res. 4S1, G9.2 (1999)). These quantum dots trap electrons in a point comprised of a tiny cluster of inorganic semiconductor material <30 nm in diameter. Many investigators believe that quantum dots will provide a variety of advances for electronics: increased efficiency, reduced power consumption, increased speed of operation and novel electronic characteristics (M. May, Science Observer, July-August (1996)). A challenge that exists is to develop general processes for creating these small nanocrystals at the required size scale.

Much of the nanocrystal work mentioned in the literature centers around inorganic/ionic materials (C. B. Murray et al., IBM J. Res. & Dev., v45, No 1., pp 47-56, January 2001). Though the number of classes of organic/molecular materials is significantly greater than inorganic compounds, the literature related to organic/molecular nanocrystals is limited to those organic compounds that form H- or J-aggregates. The number of monomer units associated with H- and J-aggregate nano crystals has been estimated to be ca. 4 monomer units per absorbing unit (A. Herz, Photog. Sci. Eng., 18, 323-335 (1974)). Interactions among dye molecules can generate large spectral shifts and/or changes in spectral band shape and intensity in absorption spectra. These magnitude and the direction of these shifts are the determined by the internal structure (i.e., H- or J-aggregate structure) of the nanocrystal. It is known that nanocrystals of certain dyes can be generated by gradually increasing their concentration in solution, and the internal structure of the nanocrystal is identified by the gradual shift of the absorption spectra to shorter wavelength (in the case of H-aggregates) or a sudden shift to longer wavelengths (as in the case of J-aggregates) (E. Jelley, Nature, 138, 1009-1010 (1936)). These H- and J-aggregate nanocrystals exhibit unique properties that differ from the properties of the bulk solid and are used in silver halide based photographic products.

The spectral shifts and/or changes in organic/molecular nanocrystals that don't form H- or J-aggregate structure in the nanocrystal may be understood by considering the analogous phenomenon of polymorphism in bulk (large) organic/molecular crystals. Polymorphism is defined as multiple crystal structures of the same molecular entity (J. Bernstein and J. Henk, *Industrial Applications of X-ray Diffraction*, Chapter 25, F. H. Chung and D. K. Smith eds., Marcel Dekker Inc., New York, 531-532 (2000)); i.e., a bulk crystal of a specific organic/molecular material may exhibit multiple crystal structures with different physical & mechanical properties, such as solubility, color, absorption, emission, bulk modulus, etc. An example of a material that exhibits polymorphism is tris(8-hydroxyquinoline) aluminum. Three polymorphs identified as α, ⊕, and γ were reported to exist (M. Brinkman et al., J. Am. Chem. Soc., 122, 5147-5157 (2000)) with α and β exhibiting yellowish-green fluorescence and γ exhibiting blue fluorescence when excited with ultraviolet light (M. Braun et al. J. Chem. Phys., 114(21), 9625-9632 (2001)). Since the fundamental phenomenon that is common to the nanocrystals that exhibit the H- & J-aggregate structures and the bulk organic/molecular crystals of organic/molecular that exhibit polymorphism is the variations in their internal structure (the structural details of how the molecules in the aggregate/solid are arranged with respect to each other), which leads to the observed changes in their physical and mechanical properties, the H- and J-aggregate structures observed organic/molecular nanocrystals may be regarded as a nanocrystalline manifestation of the polymorphism observed in bulk crystals. We refer to this manifestation as nanomorphism and the nanocrystals that exhibit nanomorphism are called nanomorphs. It is important to note that the type and number of nanomorphs that are possible for a specific organic/molecular material will be determined by the physical size of (ca. <50 nm in the shortest dimension) and the number of molecules (ca. <100) in the nanocrystal and hence need not be the same as the type and number of polymorphs of the same organic/molecular material in bulk crystal.

Another important point to note is that the type and number of polymorphs of a material that can be generated depends on the details of the method (process) by which the organic/molecular crystal is generated. For example, in the case of precipitation from liquid solvents, commonly used as the process for generating bulk crystals of organic/molecular materials, factors such as temperature, mixing, type of solvent, etc. are known to effect the type and number of polymorphs generated, for a given organic/molecular material (M. Bavin, Chem. Ind., 527-529 (1989)). Precipitation from liquid solvents is regarded as a general process for generating bulk crystals of organic/molecular materials. An analogous, general process for generating nanocrystals of organic/molecular materials is precipitation from compressed fluids such as $CO_2$ by a RESS process. (See, for example, U.S. patent application Publication US 2003/0030706 A1, published Feb. 13, 2003, in the name of Jagannathan et al.). These nanoscale particles exhibit multiple molecular packing structures that are the result of rapid depressurization leading to rapid desaturation of compressed fluid that contains an organic, organometallic, or molecular material. A fundamental difference between precipitation from liquids and precipitation from compressed fluids such as $CO_2$ by the RESS process is the significantly faster rates of supersaturation generation and dissipation (D. Matson et al., Ind. Eng. Chem. Res., 26, 2298-2306 (1987)). Hence, precipitation from compressed fluids such as $CO_2$ is a convenient process for generating nanomorphs.

Nanomorphs can be individual particles or a cluster of particles. The preferred size of nanomorph particles is less than 50 nanometers, more preferred less than 30 nanometers, and most preferred less than 20 nanometers. The molecular weight of a nanomorph has a lower limit of 10 and a preferred upper limit of 10,000, a more preferred upper limit of 20,000, and a most preferred upper limit of 100,000. Nanomorph materials are by definition a result of the novel precipitation methods described in this invention, and do not require any further processing steps, such as milling or grinding, to be of acceptable size for end use.

The article(s) made in accordance with the present invention use nanomorphs to create different colors from a single marking material. The article includes a nanomorphic marking material layer positioned on and/or in a substrate (often referred to as a receiver, support, etc.). The nanomorphic marking material luminesces at a first wavelength (depending on condition controlled during delivery) and luminesces at a second wavelength (depending on the condition controlled during delivery). The first wavelength nanomorphic marking material and the second wavelength nanomorphic marking material can have an equivalent chemical composition when compared to each other.

The marking material held by the support can include a nanocrystalline particulate having a measurable property that is non-characteristic of the same marking material in a bulk state. The median particle size of the marking material can be nanocrystalline throughout the deposit. The marking material can have a common spatial-modulation of both a luminescence wavelength profile and a median particle size in the particulate. The wavelength profile can be a peak wavelength profile.

Although the nanomorphic marking material described above can be manufactured and deposited using the apparatus and method described above, other apparatus and methods can be used. For example, the marking material can be manufactured using the process described above, collected, and then deposited using conventional technologies. Conventional technologies include, but are not limited to, incorporating the marking material in an inkjet ink and depositing the marking material using an inkjet printer; incorporating the marking material in a toner and depositing using an electrophotographic printer; incorporating the marking material on a donor sheet and depositing the marking material using a thermal printer; etc. Conventional technologies also include any technology that can be adapted to deposit the nanomorphic marking material without altering the characteristics (for example, the particle size(s)) of the nanomorphic marking material. These processes exclude those processes that lead to dissolution and re-precipitation of the marking material.

The invention has been described in detail with particular reference to certain preferred embodiments thereof, but it will be understood that variations and modifications can be effected within the scope of the invention.

What is claimed is:

1. An article comprising:
    a support; and
    an organic marking material held by said support, the marking material including a nanocrystalline particulate having a measurable property non-characteristic of the same marking material in a bulk state, wherein a luminescence wavelength profile and a median particle size in the particulate of the marking material both have the same modulation across at least one dimension of the support and the organic marking material luminesces at a first wavelength at one location of the support and luminesces at a second different wavelength at another location of the support.

2. The article according to claim 1, wherein the particulate is embedded in the support.

3. The article according to claim 1, wherein the particulate is positioned on a surface of the support.

4. The article according to claim 1, wherein the median particle size is nanocrystalline throughout the deposit.

5. The article according to claim 1, wherein the luminescence wavelength profile is a peak wavelength profile.

6. An article comprising:
    a support; and
    an organic marking material held by said support, the marking material including a nanocrystalline particulate having a measurable property non-characteristic of the same marking material in a bulk state, wherein a luminescence wavelength profile and a median particle size in the particulate of the marking material both have the same modulation across two dimensions of the support and the organic marking material luminesces at a first wavelength at one location of the support and luminesces at a second different wavelength at another location of the support.

7. The article according to claim 6, wherein the particulate is embedded in the support.

8. The article according to claim 6, wherein the particulate is positioned on a surface of the support.

9. The article according to claim 6, wherein the median particle size is nanocrystalline throughout the deposit.

10. The article according to claim 6, wherein the luminescence wavelength profile is a peak wavelength profile.

* * * * *